United States Patent
Chen

[11] Patent Number: 5,867,362
[45] Date of Patent: Feb. 2, 1999

[54] STORAGE CAPACITOR FOR DRAM MEMORY CELL

[75] Inventor: Anchor Chen, Pingtung, Taiwan

[73] Assignee: United Microelectronics Corporation, Taiwan

[21] Appl. No.: 928,334

[22] Filed: Sep. 12, 1997

Related U.S. Application Data

[62] Division of Ser. No. 661,384, Jun. 11, 1996, Pat. No. 5,744,388.

[30] Foreign Application Priority Data

May 27, 1996 [TW] Taiwan ................................. 85106287

[51] Int. Cl.⁶ .............................. H01G 4/06; H01L 2/108
[52] U.S. Cl. ...................... 361/311; 361/321.5; 257/300; 257/311
[58] Field of Search ..................................... 361/303–305, 361/311–313, 321.1–321.5, 322, 329, 330; 257/296, 300, 306–311; 438/253, 254, 393–399

[56] References Cited

U.S. PATENT DOCUMENTS 5,254,503 10/1993 Kenney .
5,447,878 9/1995 Park et al. .
5,608,247 3/1997 Brown ..................................... 257/306

FOREIGN PATENT DOCUMENTS 43 21 638   3/1994   Germany .
2-290 908   1/1996   United Kingdom .

*Primary Examiner*—Kristine Kincaid
*Assistant Examiner*—Anthony Dinkins
*Attorney, Agent, or Firm*—Rabin & Champagne, P.C.

[57] ABSTRACT

A storage capacitor structural configuration for memory cell units of DRAM devices and a process for constructing the capacitor. The capacitor includes a first electrode and a second electrode that are each electrically conducting layers, and a storage dielectric that is a dielectric layer sandwiched between the two electrodes. The silicon substrate of the device has formed thereon a field oxide layer and a transistor including a gate and a pair of source/drain regions. A first dielectric layer covers the transistor and includes a contact opening over one of the source/drain regions. The first electrode includes a first electrically conducting layer formed inside the contact opening and covering the revealed surface of the source/drain region and the first dielectric layer. A second electrically conducting layer having a rugged surface is formed on the surface of the first electrically conducting layer. A number of deep grooves are formed in the second and first electrically conducting layers, forming a grid-like configuration. The storage dielectric includes a second dielectric layer covering the surface of the grid-like configuration of the second and first electrically conducting layers. The second electrode includes a third electrically conducting layer that covers the surface of the storage dielectric.

20 Claims, 3 Drawing Sheets

STORAGE CAPACITOR FOR DRAM MEMORY CELL

This is a Division of application Ser. No. 08/661,384, filed Jun. 11, 1996, now U.S. Pat. No. 5,744,388.

BACKGROUND OF THE INVENTION

1. Field of the Invention

The invention relates in general to a storage capacitor structure for a memory cell in a semiconductor dynamic random access memory (DRAM) integrated circuit (IC) device and a process for fabricating the capacitor. In particular, the invention relates to a storage capacitor structure providing increased capacitance for a memory cell of DRAM IC devices, and its fabrication process.

2. Technical Background

As microprocessors become more and more powerful, the software programs they execute also become more and more complicated and require ever larger processing memory space. Since DRAMs currently provide the primary operating memory space for microprocessors, their operating characteristics are critical to the overall performance of the entire computer system. FIG. 1 is a schematic circuit diagram of a conventional memory cell unit that is organized in arrays to form the storage memory space for DRAM devices. FIG. 1 shows that the typical DRAM memory cell unit includes an n-type metal-oxide semiconductor field-effect transistor (NMOS transistor) 100 and a capacitor 102.

As shown in the drawing, the gate of the NMOS transistor 100 is connected to the word line WL of the device memory cell array, the source is connected to the bit line BL of the cell array, and the drain is connected to one electrode of the data storage capacitor 102, with the other electrode of the capacitor 102 being connected to the system ground plane. As persons skilled in the art are aware, a capacitor 102 utilized by the memory cell unit of FIG. 1 holds electric charges signifying the status of a stored data bit, while an NMOS transistor 100 is utilized as a bidirectional switch. Because the MOS transistor 100 has its source/drain pair functioning as either the current source or the drain, depending on whether the transistor is reading or writing digital data from or to the storage capacitor, respectively, the source and drain are generally designated as the source/drain pair herein.

A semiconductor structural configuration for a storage capacitor used in the memory cell units of a conventional DRAM device is schematically shown in the cross-sectional view of FIG. 2. The typical physical capacitor structure, which has a stacked configuration, is briefly examined with reference to this drawing. To fabricate such a capacitor element for the memory cell units of DRAM devices, a field oxide layer 202, a gate oxide layer 204, a first polysilicon layer 206, a sidewall spacer 208, and source/drain regions 210 of the NMOS transistor are sequentially formed over the surface of a silicon substrate 200. After the formation of the transistor, an oxide layer 212, such as silicon dioxide ($SiO_2$), is then deposited over the substrate surface. Then, a contact opening 214 is formed at a designated location above the source/drain region 210 by etching the oxide layer 212. The contact opening 214 is then filled with a second polysilicon layer 216 to provide an external contact for the source/drain region 210 of the transistor element. Next, a dielectric layer 218 is deposited on top of the second polysilicon layer 216. The dielectric layer 218 can be, for example, a nitride/oxide (NO) layer or an oxide/nitride/oxide (ONO) layer. Finally, a third polysilicon layer 220 is formed atop the dielectric layer 218. Thus, at this stage, the second polysilicon layer 216, the dielectric layer 218, and the third polysilicon layer 220 form the storage capacitor 102 shown in the schematic circuit diagram of FIG. 1.

As is well known, capacitance and leakage characteristics of this storage capacitor are important to the performance of a DRAM device composed of memory cell arrays utilizing these capacitors. Specifically, a larger capacitor electrode surface area sustains data content longer, therefore requiring a lower memory cell content refresh rate. This results directly in improved memory subsystem performance in a host digital system. However, physically larger capacitors go against the trend of device miniaturization in manufacturing high-density DRAM devices.

Conventional storage capacitors for DRAM memory cell units such as the one depicted in FIG. 2 suffer from unsatisfactory capacitance characteristics. Specifically, conventional DRAM devices are equipped with storage capacitors for their memory cell units that have insufficient capacitance values. These capacitors require improvement to meet the standards set for modern microprocessor-based computer systems, in order to provide improved overall system performance.

SUMMARY OF THE INVENTION

It is therefore an object of the invention to provide a capacitor structure for DRAM device memory cell units that provides improved capacitance characteristics, and a process for fabricating the capacitor.

It is another object of the invention to provide a capacitor structure for DRAM device memory cell units that provides improved capacitance characteristics and has reduced overall dimensions suitable for high-density semiconductor integration, and a process for fabricating the capacitor.

In one embodiment, the invention achieves the above-identified objects by providing a process for fabricating a storage capacitor for DRAM memory cell units in a semiconductor device. First, a field oxide layer and a transistor including a gate and a pair of source/drain regions are formed on the silicon substrate of the device. The transistor is then covered with a first dielectric layer and a contact opening is formed in the first dielectric layer over one of the source/drain regions, revealing the surface of the source/drain region. A first electrically conducting layer is then formed inside the contact opening, covering the revealed surface of the source/drain region and the first dielectric layer. Next, a second electrically conducting layer having a rugged surface is formed on the surface of the first electrically conducting layer. A photolithographic procedure is then performed to etch into the second and first electrically conducting layers through the use of a photomask layer, the photolithographic procedure resulting in a grid-like configuration being formed in the second and first electrically conducting layers. The conducting layers have grooves cutting deep thereinto. The grid-like configuration of the second and first electrically conducting layers form one of the electrodes of the storage capacitor. A second dielectric layer is formed covering the surface of the grid-like configuration of the second and first electrically conducting layers, wherein the second dielectric layer forms the storage dielectric of the storage capacitor. A third electrically conducting layer is then formed covering the surface of the second dielectric layer, wherein the third electrically conducting layer forms the other electrode of the storage capacitor.

In another embodiment, the invention achieves the above-identified objects by providing a storage capacitor structural configuration for DRAM memory cell units devices that includes first and a second electrodes formed as electrically conducting layers and a storage dielectric that is a dielectric layer sandwiched between the two electrodes. The silicon substrate of the device has formed thereon a field oxide layer and a transistor including a gate and a pair of source/drain regions. A first dielectric layer covers the transistor and has a contact opening over one of the source/drain regions. The first electrode includes a first electrically conducting layer formed inside the contact opening and covering the revealed surface of the source/drain region and the first dielectric layer. A second electrically conducting layer, which has a rugged surface, is formed on the surface of the first electrically conducting layer. A number of deep grooves are formed in the second and first electrically conducting layers, creating a grid-like configuration. The storage dielectric includes a second dielectric layer covering the surface of the grid-like configuration formed in the second and first electrically conducting layers. The second electrode includes a third electrically conducting layer that covers the surface of the storage dielectric.

BRIEF DESCRIPTION OF THE DRAWING

Other objects, features, and advantages of the invention will be apparent by way of the following detailed description of the preferred but non-limiting embodiments. The description is made with reference to the accompanying drawings in which.

DETAILED DESCRIPTION OF THE PREFERRED EMBODIMENT

A detailed description of the inventive process of the invention follows with reference to FIGS. 3A–3E, which are cross-sectional views of a memory cell unit for a DRAM device fabricated in accordance with a preferred process of the invention. Note that these schematic drawings are not presented to exact physical dimensional scales, and serve only to depict the structure and process steps of the invention.

Figure 3A:
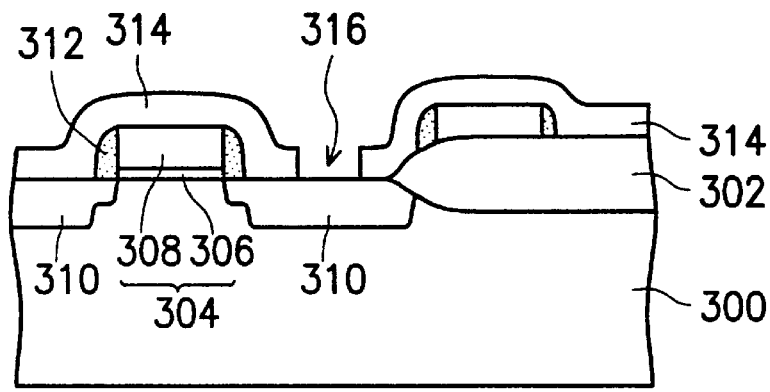

As is seen in FIG. 3A, a silicon substrate 300 is provided as the basis for the construction of a DRAM memory device which includes an array of memory cell units, each including a transistor-capacitor pair. A process of, for example, local oxidation of silicon (LOCOS procedure) is first utilized to form a field oxide layer 302 over the surface of the substrate 30 defining the active region of the transistor. The transistor gate 304, which includes a gate oxide layer 306 formed and shaped over the surface of the substrate 300 and covered by a first polysilicon layer 308, is then fabricated. After that, source/drain regions 310 having lightly-doped drain (LDD) characteristics are formed. Silicon nitride side wall spacers 312 may be used to cover the sidewalls of the transistor gate 304 to prevent short channel effects between the gate and the source/drain regions of the transistor thus formed. Details for fabricating the gate and source/drain configuration for a memory cell transistor are well known in the art, and will not be elaborated herein.

A first dielectric layer 314 is then formed covering the surface of the transistor gate 304 and the source/drain regions 310. This dielectric layer 314 may be of a nitride/oxide (NO) or oxide/nitride/oxide (ONO) configuration, or it may be a silicon nitride or a silicon dioxide layer. After the formation of the dielectric layer 314, a contact opening 316 is formed in this dielectric layer to reveal the surface of the source/drain region 310 of the transistor, as depicted in the drawing.

Figure 3B:
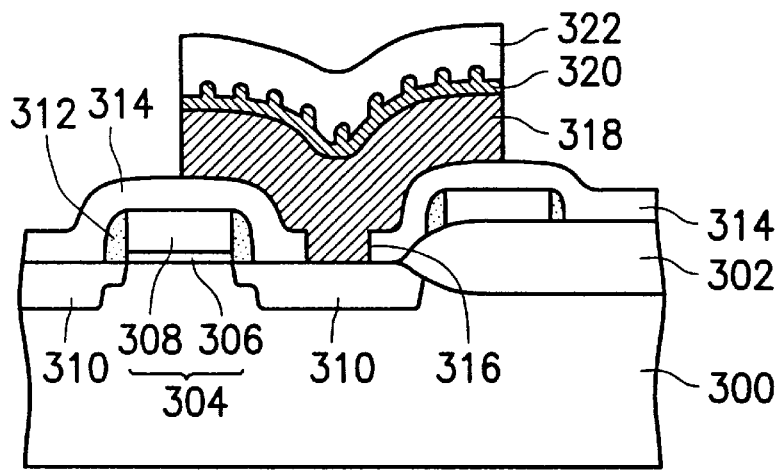

Subsequently, as is seen in FIG. 3B, a first electrically conducting layer 318, having a thickness of about 3,000–5,000 Å, is formed over the surface of the dielectric layer 314, filling the contact opening 316, as shown in the drawing. This first electrically conducting layer 318 may be a polysilicon layer formed by deposition using, for example, a low pressure chemical vapor deposition (LPCVD) procedure conducted in an atmosphere of heated and ionized silicane ($SiH_4$). Then, at a temperature of about 560°–590° C., a second electrically conducting layer 320 having a thickness of about 500–01,000 Å and rugged surface characteristics, as schematically depicted in the drawing, is then deposited over the surface of the first electrically conducting layer 318. The second electrically conducting layer 320 may be of the same material, that is, polysilicon, as that of first electrically conducting layer 318. A photolithography procedure is then utilized to etch into the first and second electrically conducting layers 318 and 320, the procedure including the use of a photomask layer 322 deposited on the second electrically conducting layer 320, in a two-phase etching process including a main etching step and an overetching step.

Figure 3C:
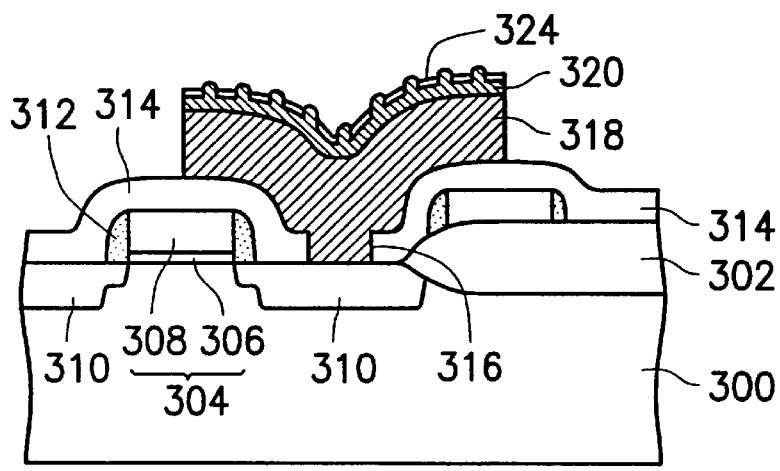

Specifically, the main etching step generally shapes the first and second electrically conducting layers 318 and 320 into the shape schematically shown in FIG. 3B, leaving first and second electrically conducting layers 318 and 320 covering the contact opening 316 and adjacent portions of the first dielectric layer 314. During the second etching phase, the timely, controlled overetching step not only cleanly removes all the residual portions of the first electrically conducting layer 318 exposed outside the coverage of the photomask layer 322, but also etches into the photomask layer 322 itself. Thus, the overetching step consumes almost the entire layer of the photomask 322, leaving only "micro photomask layers" 324 in the recessed portions between the protruding portions of the rugged surface of the second electrically conducting layer 320, as is schematically depicted in FIG. 3C.

Figure 3D:
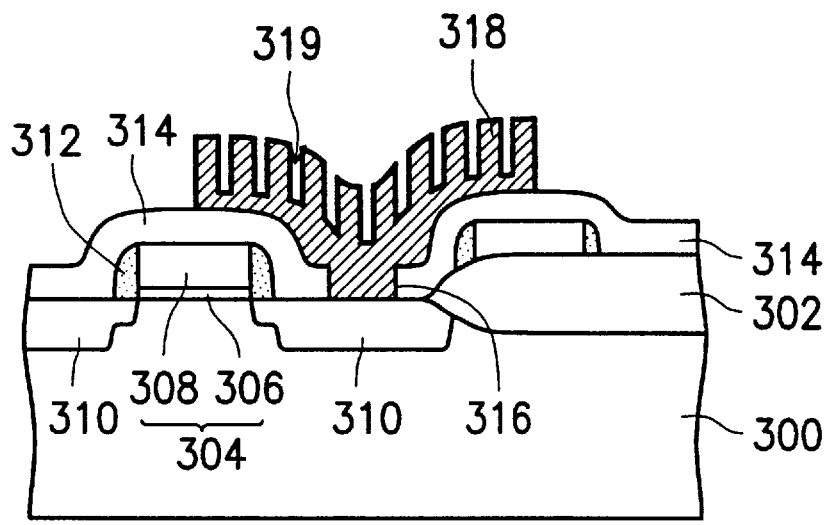

Referring next to FIG. 3D, the overetching step continues, with the micro photomask layers 324 utilized as the masking elements, to consume farther into the entire configuration. This sustained overetching procedure eventually consumes the micro photomask layers 324 entirely, as well as the remaining second electrically conducting layer 320. But before that happens, deep grooves 319 take shape in the first electrically conducting layer 318 as shown in the drawing. The overetching thus concludes when the grooves 319 reach a substantial depth of about, for example, 0.2–0.3 μm. Because the original rugged surface of the second electrically conducting layer 320 may have recesses and protrusions in a two-dimensional pattern, the overetching creates a grid-like configuration (also as observed in the cross-sectional view) in the first electrically conducting layer 318. In the depicted example, the second electrically conducting layer 320 is consumed completely, although this may not necessarily be the case. In other words, when the grooves 319 reach the desired depth during the overetching step, there may still be residual portions of the second electrically conducting layer 320 remaining on top of the first electrically conducting layer 318.

Figure 1:
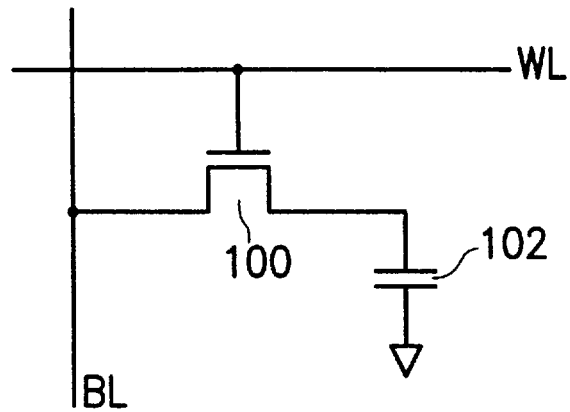
FIG. 1 is a schematic circuit diagram of a memory cell unit of a DRAM device.
Figure 2:
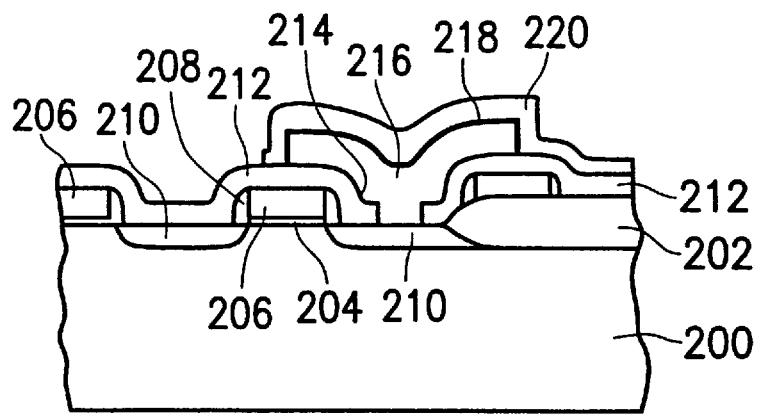
FIG. 2 is a schematic cross-sectional view of a conventional memory cell unit of a DRAM device and FIGS. 3A–3E are cross-sectional views of the memory cell unit for a DRAM device fabricated in accordance with a preferred embodiment of the invention.
Figure 3E:
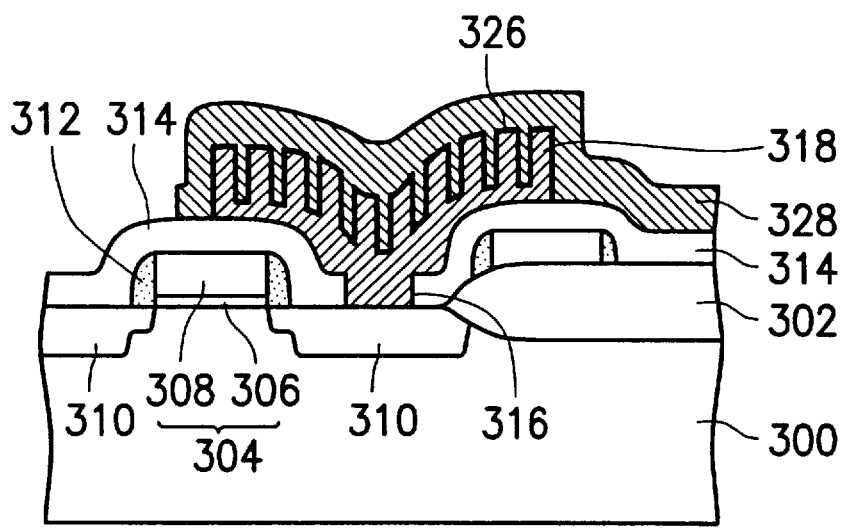

Next, as shown in FIG. 3E, a second dielectric layer 326 is formed and shaped over the exposed surface of the grooved first electrically conducting layer 318. Then, a third electrically conducting layer 328 is formed and shaped on the surface of the second dielectric layer 326. Thus, the first electrically conducting layer 318, the third electrically conducting layer 328, and the second dielectric layer 326 together form the two electrode layers and the storage dielectric, respectively, for the memory cell storage capacitor, which is, for example, the capacitor 102 in the circuit diagram of FIG. 1. The dielectric layer 326 may be, for example, an NO, ONO, silicon nitride, or silicon dioxide layer formed in a CVD procedure. The third electrically conducting layer 328 may be, for example, a polysilicon layer.

Specifically, the following advantages result from using a storage capacitor thus formed for the memory cell unit of a DRAM device, which has a noticeably higher capacitance due to the increased electrode surface area resulting from the formation of the grooves 319 in the first electrically conducting layer 318:

(a) The possibility of soft errors caused by alpha particles during data retrieval access periods in the memory cell are greatly reduced.

(b) The possibility of undesirable data content change due to the inevitable factor of capacitor leakage current in the storage capacitor is greatly reduced.

(c) The capacitor refresh rate can be reduced to increase the duty cycle of the memory device.

Post fabricational procedure steps following the formation of the storage capacitor as outlined in FIGS. 3A–3E are still required to complete the fabrication of a complete DRAM memory device, as persons skilled in the art appreciate. Since these post procedural steps are not relevant to the invention, they are not elaborated here.

While the invention has been described by way of example and in terms of preferred embodiments, it is to be understood that the invention is not limited to the disclosed embodiments. To the contrary, it is intended to cover various modifications and similar arrangements as would be apparent to those of skill in the art. Thus, the scope of the appended claims should be accorded the broadest interpretation so as to encompass all such modifications and similar structures.

What is claimed is:

1. A storage capacitor for a memory cell unit of a dynamic random access memory semiconductor device, comprising a first electrode and a second electrode, and a storage dielectric that is a dielectric layer located between said first and second electrodes, wherein a silicon substrate of said device has formed thereon a field oxide layer and a transistor comprising a gate and a pair of source/drain regions, wherein a first dielectric layer covers said transistor, and wherein a contact opening is formed in said first dielectric layer over one of said source/drain regions, revealing a surface of said one source/drain region; wherein:

said first electrode comprises a first electrically conductive layer formed inside said contact opening and covering the revealed surface of said one source/drain region and portions of said first dielectric layer on all sides of said contact opening, and a second electrically conductive layer having a rugged surface formed on the surface of said first electrically conductive layer, wherein a plurality of protrusions and recessed portions are formed in said second and first electrically conductive layers in a grid-like configuration;

said storage dielectric includes a second dielectric layer covering a surface of said grid-like configuration of said second and first electrically conductive layers; and said second electrode includes a third electrically conductive layer covering a surface of said storage dielectric.

2. The storage capacitor of claim 1, wherein either of said first and second dielectric layers has a nitride/oxide configuration.

3. The storage capacitor of claim 1, wherein either of said first and second dielectric layers has an oxide/nitride/oxide configuration.

4. The storage capacitor of claim 1, wherein either of said first and second dielectric layers is a silicon nitride layer.

5. The storage capacitor of claim 1, wherein either of said first and second dielectric layers is a silicon dioxide layer.

6. A memory cell of a memory device, comprising:

a substrate;

a transistor formed on the substrate, the transistor including a gate and a pair of source/drain regions;

a first dielectric layer covering the transistor, wherein a contact opening is formed in the first dielectric layer over one of the source/drain regions, revealing a surface of said one source/drain region; and a storage capacitor, comprising:

a first electrically conductive layer formed inside said contact opening and covering the revealed surface of said one source/drain region and at least a portion of said first dielectric layer, wherein said first electrically conductive layer includes a plurality of projections extending in a direction away from and generally perpendicular to a top surface of the first dielectric layer, which is a first electrode of said storage capacitor;

a second dielectric layer covering a surface of the first electrically conductive layer; and a second electrically conductive layer covering a surface of the second dielectric layer, which is a second electrode of said storage capacitor.

7. The storage capacitor of claim 6, wherein the plurality of projections includes three or more projections.

8. The storage capacitor of claim 6, wherein the plurality of projections are arranged to form a two-dimensional grid of projections.

9. The storage capacitor of claim 6, wherein the plurality of projections extend to a height in a range of about 0.2 µm to about 0.3 µm.

10. The storage capacitor of claim 6, wherein either of said first and second dielectric layers has a nitride/oxide configuration.

11. The storage capacitor of claim 6, wherein either of said first and second dielectric layers has an oxide/nitride/oxide configuration.

12. The storage capacitor of claim 6, wherein either of said first and second dielectric layers is a silicon nitride layer.

13. The storage capacitor of claim 6, wherein either of said first and second dielectric layers is a silicon dioxide layer.

14. A memory cell of a memory device, comprising:

a substrate;

a transistor formed on the substrate, the transistor including a gate and a pair of source/drain regions;

a first dielectric layer covering the transistor, wherein a contact opening is formed in the first dielectric layer over one of the source/drain regions, revealing a surface of said one source/drain region; and a storage capacitor, comprising:

a first electrically conductive layer formed inside said contact opening and covering the revealed surface of said one source/drain region and at least a portion of said first dielectric layer, wherein said first electrically conductive layer includes a plurality of grooves extending in a direction toward and generally perpendicular to a top surface of the first dielectric layer, which is a first electrode of said storage capacitor;

a second dielectric layer covering a surface of the first electrically conductive layer; and a second electrically conductive layer covering a surface of the second dielectric layer, which is a second electrode of said storage capacitor.

15. The storage capacitor of claim 14, wherein the plurality of grooves are arranged to form a two-dimensional grid of grooves.

16. The storage capacitor of claim 14, wherein the plurality of grooves extend to a depth in a range of about 0.2 $\mu$m to about 0.3 $\mu$m.

17. The storage capacitor of claim 14, wherein either of said first and second dielectric layers has a nitride/oxide configuration.

18. The storage capacitor of claim 14, wherein either of said first and second dielectric layers has an oxide/nitride/oxide configuration.

19. The storage capacitor of claim 14, wherein either of said first and second dielectric layers is a silicon nitride layer.

20. The storage capacitor of claim 14, wherein either of said first and second dielectric layers is a silicon dioxide layer.

* * * * *